(12) United States Patent
He et al.

(10) Patent No.: US 10,297,220 B2
(45) Date of Patent: May 21, 2019

(54) GATE DRIVING CIRCUIT AND CORRESPONDING DISPLAY DEVICE

(71) Applicants: Boe Technology Group Co., Ltd., Beijing (CN); Beijing Boe Optoelectronics Technology Co., Ltd., Beijing (CN)

(72) Inventors: Quanhua He, Beijing (CN); Hao Zhang, Beijing (CN); Lingyun Shi, Beijing (CN); Junjie Ma, Beijing (CN); Jinshan Liu, Beijing (CN); Zijiao Xue, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 6 days.

(21) Appl. No.: 15/525,917

(22) PCT Filed: Sep. 2, 2016

(86) PCT No.: PCT/CN2016/097845
§ 371 (c)(1),
(2) Date: May 10, 2017

(87) PCT Pub. No.: WO2017/121129
PCT Pub. Date: Jul. 20, 2017

(65) Prior Publication Data
US 2018/0090088 A1    Mar. 29, 2018

(30) Foreign Application Priority Data

Jan. 12, 2016    (CN) .......................... 2016 1 0018208

(51) Int. Cl.
G09G 3/20    (2006.01)
G09G 3/36    (2006.01)
(Continued)

(52) U.S. Cl.
CPC ....... G09G 3/3674 (2013.01); G02F 1/13306 (2013.01); G09G 3/20 (2013.01);
(Continued)

(58) Field of Classification Search
CPC .............. G02F 1/13306; G09G 3/3674; G09G 2310/0286; G09G 3/3677; G09G 3/36;
(Continued)

(56) References Cited

U.S. PATENT DOCUMENTS 4,426,646 A * 1/1984 Yamaguchi .............. G09G 3/29
345/61
4,922,240 A * 5/1990 Duwaer ................ G02F 1/1345
345/100

(Continued)

FOREIGN PATENT DOCUMENTS

CN    1317779 A    10/2001
CN    1577465 A    2/2005
(Continued)

OTHER PUBLICATIONS

International Search Report and Written Opinion with English Translation dated Aug. 12, 2016, Application No. PCT/CN2016/097845.

(Continued)

Primary Examiner — Michael J Jansen, II
(74) Attorney, Agent, or Firm — Womble Bond Dickinson (US) LLP

(57) ABSTRACT

Embodiments of the invention disclose a gate driving circuit and a corresponding display device. The gate driving circuit comprises: an area gating control module for gating a (Continued)

corresponding area in a circuit to be driven according to the received area control signal, a gate line gating control module gating a corresponding gate line in a gated area of the circuit to be driven, and a gate driving signal output module, and of which an output terminal is connected to a corresponding gate line, wherein if the logic value represented by the received gate line gating signal is 1, the gate driving signal output module outputs a driving signal for turning on the gate line, and otherwise, outputs a driving signal for turning off the gate line.

18 Claims, 9 Drawing Sheets

(51) Int. Cl.
*G02F 1/133* (2006.01)
*H03K 19/20* (2006.01)
(52) U.S. Cl.
CPC ..... *H03K 19/20* (2013.01); *G09G 2300/0408* (2013.01); *G09G 2310/0267* (2013.01)
(58) Field of Classification Search
CPC ......... G09G 3/3688; G09G 2310/0267; G09G 3/3611; G09G 3/3266; G09G 3/3659; G09G 3/3666; G09G 2310/0202; G09G 3/3258; H03K 19/20
See application file for complete search history.

(56) References Cited

U.S. PATENT DOCUMENTS

| | | | |
|---|---|---|---|
| 6,417,829 B1 | 7/2002 | Jung et al. | |
| 7,583,246 B2* | 9/2009 | Ito | G09G 3/3677 345/100 |
| 7,821,299 B2* | 10/2010 | Liu | G09G 3/3674 326/105 |
| 7,924,260 B2* | 4/2011 | Tu | G11C 19/00 345/100 |
| 8,305,313 B2* | 11/2012 | Furuya | G09G 3/006 345/204 |
| 8,358,292 B2* | 1/2013 | Nagashima | G09G 3/3677 345/100 |
| 9,001,026 B2* | 4/2015 | Hsu | G09G 3/344 345/107 |
| 9,153,182 B2* | 10/2015 | Hsu | G09G 3/344 |
| 9,343,027 B2* | 5/2016 | Zhu | G09G 3/3648 |
| 9,613,578 B2* | 4/2017 | Tan | G09G 3/3648 |
| 9,626,028 B2* | 4/2017 | Li | G06F 3/0412 |
| 9,793,006 B2* | 10/2017 | Zheng | G11C 19/287 |
| 9,824,614 B2* | 11/2017 | Lee | G09G 3/20 |
| 9,905,153 B2* | 2/2018 | He | G09G 3/2085 |
| 9,997,136 B2* | 6/2018 | Cao | G11C 19/287 |
| 10,147,394 B2* | 12/2018 | Song | G09G 3/20 |
| 2001/0052887 A1* | 12/2001 | Tsutsui | G09G 3/3648 345/87 |
| 2005/0068278 A1* | 3/2005 | Ito | G09G 3/3677 345/87 |
| 2006/0028421 A1* | 2/2006 | Nakamura | G09G 3/3677 345/99 |
| 2006/0028463 A1* | 2/2006 | Nakamura | G09G 3/3677 345/204 |
| 2007/0040792 A1* | 2/2007 | Kwag | G09G 3/2092 345/100 |
| 2007/0103346 A1* | 5/2007 | Liu | G09G 3/3674 341/50 |
| 2009/0079713 A1* | 3/2009 | Nagashima | G09G 3/3677 345/204 |
| 2009/0102778 A1* | 4/2009 | Tu | G09G 3/3688 345/100 |
| 2009/0219238 A1* | 9/2009 | Furuya | G09G 3/006 345/87 |
| 2010/0039423 A1* | 2/2010 | Jeong | G09G 3/3266 345/213 |
| 2012/0280952 A1* | 11/2012 | Hsu | G09G 3/344 345/204 |
| 2015/0154902 A1* | 6/2015 | Lee | G09G 3/20 345/213 |
| 2015/0179109 A1* | 6/2015 | Hsu | G09G 3/344 345/107 |
| 2015/0248867 A1* | 9/2015 | Tan | G09G 3/3648 345/100 |
| 2016/0049208 A1* | 2/2016 | Zheng | G09G 3/20 345/212 |
| 2016/0055811 A1* | 2/2016 | Zhu | G09G 3/3648 345/214 |
| 2016/0189677 A1* | 6/2016 | Cao | G11C 19/287 345/691 |
| 2016/0259455 A1* | 9/2016 | Li | G06F 3/0412 |
| 2016/0293090 A1* | 10/2016 | Long | G09G 3/2092 |
| 2016/0358586 A1* | 12/2016 | Song | G09G 3/20 |
| 2016/0372078 A1* | 12/2016 | Song | G09G 3/20 |
| 2017/0061912 A1* | 3/2017 | Kitayama | G09G 3/3614 |
| 2017/0213497 A1* | 7/2017 | Shang | G09G 3/2092 |
| 2017/0301304 A1* | 10/2017 | Gao | G09G 3/3677 |
| 2017/0372651 A1* | 12/2017 | He | G09G 3/2085 |
| 2018/0024678 A1* | 1/2018 | Nitobe | G06F 3/0412 |
| 2018/0090088 A1* | 3/2018 | He | G09G 3/3674 |

FOREIGN PATENT DOCUMENTS

| | | |
|---|---|---|
| CN | 1885379 A | 12/2006 |
| CN | 202996250 U | 6/2013 |
| CN | 103345911 A | 10/2013 |
| CN | 103680439 A | 3/2014 |
| CN | 103680443 A | 3/2014 |
| CN | 103943085 A | 7/2014 |
| CN | 104700765 A | 6/2015 |
| CN | 105118470 A | 12/2015 |
| CN | 105448226 A | 3/2016 |
| KR | 100312755 B1 | 11/2001 |

OTHER PUBLICATIONS

Office Action in Chinese Application No. 201610018208.5 dated Aug. 16, 2017, with English translation.

* cited by examiner

GATE DRIVING CIRCUIT AND CORRESPONDING DISPLAY DEVICE

RELATED APPLICATIONS

The present application is the U.S. national phase entry of PCT/CN2016/097845, with an international filing date of Sep. 2, 2016, which claims the benefit of Chinese Patent Application No. 201610018208.5 filed on Jan. 12, 2016, the entire disclosures of which are incorporated herein by reference.

TECHNICAL FIELD

The invention relates to the field of tablet display technology, and in particular, to a gate driving circuit and a corresponding display device.

BACKGROUND OF THE INVENTION

Nowadays, on a small sized display panel, to reduce cost and implement an appearance of narrow borders, a gate driving circuit is formed on an array substrate, a gate driver on array (GOA) model results from the integration, and the gates are driven to be opened row by row by a GOA timing signal. However, the current GOA may only scan row by row, which may not meet the needs of diversity, and limited to the current technology, the border distance of the narrow border may not be decreased any more, and there is a need for a new gate driving circuit.

SUMMARY

According to an aspect of the application, there is provided a gate driving circuit. The gate driving circuit comprises: an area gating control module which comprises an area control signal input terminal for receiving an area control signal, and of which an output terminal outputs an area gating signal for gating a corresponding area in a circuit to be driven according to the received area control signal, a gate line gating control module which comprises a row control signal input terminal for receiving a row control signal and an area gating signal input terminal for receiving the area gating signal, and of which the output terminal outputs a gate line gating signal for gating a corresponding gate line in a gated area of the circuit to be driven according to the received row control signal and area gating signal, and a gate driving signal output module which comprises a gate line gating signal input terminal for receiving a gate line gating signal, a first level driving signal input terminal for receiving a driving signal for turning on a gate line and a second level driving signal input terminal for receiving a driving signal for turning off a gate line, and of which the output terminal is connected to a gate line, wherein in response to the logic value represented by the received gate line gating signal being 1, the gate driving signal output module outputs the driving signal for turning on the gate line, and in response to the logic value represented by the received gate line gating signal being not 1 outputs the driving signal for turning off the gate line.

According to another aspect of the application, there is provided a display device comprising a gate driving circuit described above.

The invention provides a novel gate driving circuit which, using a mode where which gate line is turned on is controlled by partitioning gate lines plus an area control signal and a row control signal. The Summary is provided to introduce a selection of concepts in a simplified form that are further described below in the Detailed Description of the Invention. The Summary is not intended to identify key features or essential features of the claimed subject matter, nor is it intended to be used to help ascertain the scope of the claimed subject matter.

BRIEF DESCRIPTION OF THE DRAWINGS

In order to more clearly illustrate the technical solutions in embodiments of the invention and alternatively in the prior art, the appended drawings necessary for use in the description of the embodiments and alternatively the prior art will be introduced briefly in the following. Obviously, the drawings in the following description are some embodiments of the invention, and for those of ordinary skills in the art, other drawings may also be obtained according to these drawings under the premise of not paying out creative work.

DETAILED DESCRIPTION OF THE INVENTION

In the following the technical solutions in embodiments of the invention will be described clearly and completely in connection with the drawings in the embodiments of the invention, to make the objectives, technical solutions and advantages of the embodiments of the invention clearer. Obviously, the described embodiments are a part of the embodiments of the invention, and not all of the embodiments. Based on the embodiments in the invention, all the other embodiments obtained by those of ordinary skills in the art under the premise of not paying out creative work pertain to the scope protected by the invention.

Embodiment One

Figure 1:
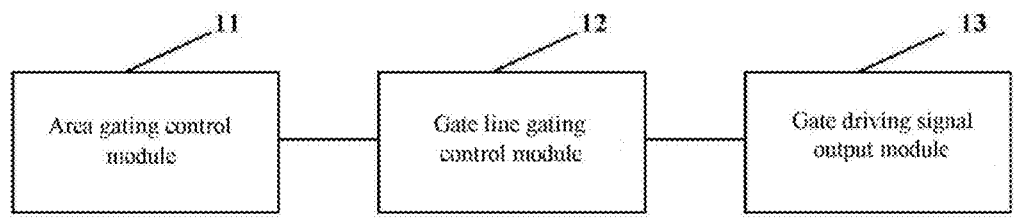
FIG. 1 shows a first structure diagram of a gate driving circuit provided by Embodiment One of the disclosure.

As shown in FIG. 1, it is a structure diagram of a gate driving circuit provided by Embodiment One of the invention, comprising: an area gating control module 11, a gate line gating control module 12 and a gate driving signal output module 13, wherein: the area gating control module 11 comprises an area control signal input terminal for receiving an area control signal, and an output terminal of the area gating control module 11 outputs an area gating signal according to the received area control signal, the gate line gating control module 12 comprises a row control signal input terminal for receiving a row control signal and an area gating signal input terminal for receiving the area gating signal, and an output terminal of the gate line gating control module 12 outputs a gate line gating signal for gating a corresponding gate line in a gated area of the circuit to be driven according to the received row control signal and area gating signal, and the gate driving signal output module 13 comprises a gate line gating signal input terminal for receiving a gate line gating signal, a first level driving signal input terminal for receiving a first level driving signal and a second level driving signal input terminal for receiving a second level driving signal, and an output terminal of the gate driving signal output module 13 is connected to a gate line, wherein if the logic value represented by the received gate line gating signal is 1, the gate driving signal output module outputs a first level driving signal, and otherwise, outputs a second level driving signal.

Figure 2:
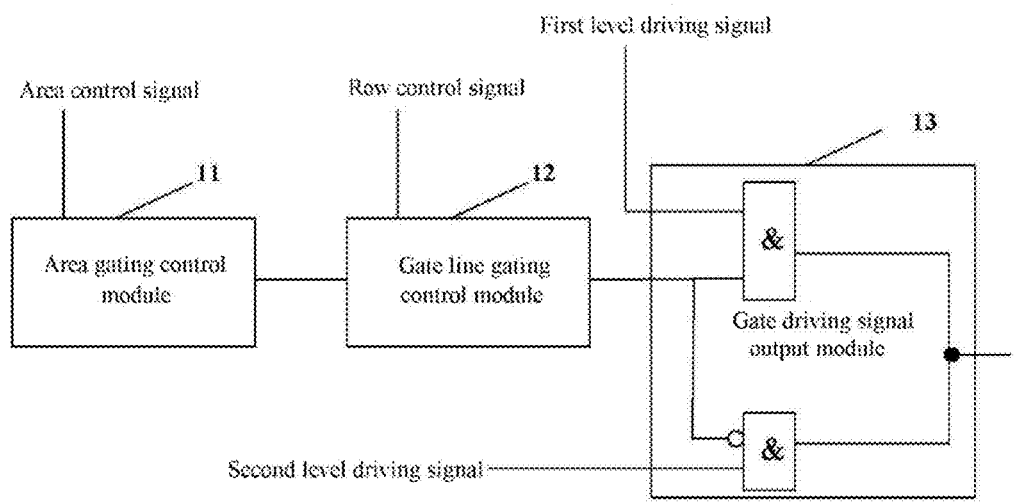
FIG. 2 shows a second structure diagram of the gate driving circuit provided by Embodiment One of the disclosure.

It needs to be noted that, for a whole display panel, although the numbers of the area gating control module 11, the gate line gating control module 12 and the gate driving signal output module 13 respectively shown in FIG. 1 and FIG. 2 are all one, their numbers are not limited to one, but may be a plurality, and their respective numbers may be dependent on the control strategy of areas and gate lines and the circuit design strategy.

For example, the number of the area gating control module(s) may be equal to the number of the divided areas, and the internal structure of each one is different, so as to enable a different area according to a different input (e.g., the logic value of the outputted area gating signal is 1 in case of being enabled). Of course, the number of the area gating control module(s) 11 may also be one.

The number of the gate line gating control module 12 may also be one and alternatively a plurality. An area gating control module 11 may have multiple output gate line gating signals to connect different gate line gating control modules 12, and such an area gating control module 11 may enable a corresponding one of the plurality of gate line gating control modules 12 according to a different input signal. Also, it may have only one output gate line gating signal to connect only one gate line gating control module 12, and the gate line gating control module 12 may operate according to a different gate line gating signal that is input.

Likewise, the number of the gate driving signal output module 13 may also be one and alternatively a plurality, and the one and alternatively the plurality of gate driving signal output modules 13 output one and alternatively more output signal(s) to drive a corresponding gate line according to a different input signal.

An area is involved in the above mentioned area control signal and area gating signal, and a row is involved in the row control signal and gate line gating signal. The area herein refers to one obtained after the gate lines are partitioned, the area control signal is used for controlling the working state of an individual area, and when the area gating signal of a certain area is output according to an input area control signal, the certain area is in a working state. The row herein refers to one in each area, the gate driving signal output module(s) in each area is connected to individual rows of gate lines externally, and since the controlled gate lines are counted by row, here a row is used to refer to a row of gate lines. When an area is in a working state, when a gate line gating signal of a row of gate lines is output according to a row control signal input to a gate line gating control module in the area, the row in the area is in a working state.

The above mentioned first level driving signal and second level driving signal are voltage signals required for opening and closing a thin film transistor TFT on a substrate, whereas the area control signal and the row control signal are voltage signals for controlling whether an area gating control module and a gate line gating control module are in a working state and alternatively a non-working state. Generally, the voltage value of the first level driving signal and alternatively the second level driving signal is greater than the voltage values of the area control signal and the row control signal.

A solution of the embodiment of the disclosure provides a novel gate driving circuit which, using a mode where which gate line is turned on is controlled by partitioning gate lines plus an area control signal and a row control signal, may adjust the area control signal and the row control signal as needed and scans all of the gate lines in a certain area and alternatively scans some specified gate lines in the area.

The above described gate driving circuit may be integrated into a driver IC. As compared to the existing gate driver on array GOA, since the gate driving circuit is integrated into a driver IC and it is unnecessary to integrate the gate driving circuit on the panel, the width of the border of the display device is thus reduced. Moreover, as compared to the existing GOA, the yield of the display panel is improved, because the existing GOA is formed on an array substrate, during the preparation of the array substrate, the formation of the gate driving circuit is added, and if there is a problem with the gate driving circuit, it means that a problem occurs to the array substrate, which results in a decreased yield of the array substrate. The solution of the embodiment of the application does not form the gate driving circuit on an array substrate, and therefore improves the yield of the display panel.

The above described area control signal and row control signal may be output by the driver IC, and in particular, may be obtained by signals output by vacant pins on the driver IC.

The first level driving signal and the second level driving signal may also be output by the driver IC.

Embodiment Two

In the solution of Embodiment Two of the disclosure, a further embodiment is provided with respect to the embodiment of FIG. 1.

In Embodiment Two, the gate driving circuit is partitioned, and an area control signal is used to control the working state of an individual area, and when there is a need for ensuring that only one area is in a working state at one and the same time, each area may be allocated a unique area gating signal. If the gate driving circuit is divided into M areas for controlling corresponding areas of a circuit to be driven, the area control signal may be constituted by J first sub-control signals, wherein both M and J are positive integers, and here the constraint relationship between J and M is that the J-th power of 2 is greater than and alternatively equal to M. Here, the first sub-control signal is a signal with the logical value of 0 and alternatively 1.

When each area corresponds to N groups of gate lines (each group of gate lines may be just one gate line, and alternatively also may be a plurality of gate lines), the row control signal may be constituted by L second sub-control signals, wherein both N and L are positive integers, and here the constraint relationship between N and L is that the L-th power of 2 is greater than and alternatively equal to N. When there is a need for ensuring that only one gate line is in a working state in one and the same area at one and the same time, each group of gate lines is allocated a unique gate line gating signal.

In particular, the gate driving signal output module comprises:

a first AND gate of which a first input terminal receives a first level driving signal, of which a second input terminal receives a gate line gating signal of a gate line gating control module, and of which an output terminal is connected to a gate line externally, a second AND gate of which a first input terminal receives a second level driving signal, of which a second input terminal receives a NOT signal of the gate line gating signal output by the gate line gating control module, and of which an output terminal is connected to the gate line externally, and a NOT gate of which an input terminal is connected with the output terminal of the gate line gating control module, and of which an output terminal is connected with the second input terminal of the second AND gate.

A circuit comprising the above described first AND gate, second AND gate and NOT gate is specifically as shown in FIG. 2, in which the second AND gate is merged with the NOT gate, and a circle is added to an input terminal of the second AND gate, representing that a NOT operation is first performed on a logic value input to the input terminal and then an AND operation is performed on the logic value obtained after the NOT operation and a logic value input to the other input terminal.

It may be seen from the characteristics of a logic circuit itself that, there are a variety of logic circuits that may implement the gate driving signal output module of embodiments of the application, what is given in FIG. 2 is just a relatively simple implementation, and the specific circuit structure of the gate driving signal output module of embodiments of the application is not limited to what is shown in FIG. 2. Moreover, it needs to be noted that in the gate driving circuit, when there are a plurality of gate driving signal output modules, these gate driving signal output modules may adopt different implementations.

The solution of Embodiment Two of the disclosure uses logic circuits for implementation, and uses logic signals to form area control signals and row control signals, which will be further described in the following by specific embodiments. The basic idea of Embodiment Two is to implement respective modules by combining logic gate circuits, and the basic idea of Embodiment Three is to implement the area gating control module(s) and the gate line gating control module(s) by using decoders.

Embodiment Two of the application implements the gate driving circuit in Embodiment One by using a combination of logic gate circuits. Since a logic gate circuit is designed according to actual needs, the needs for an area gating control module in an individual area and a gate line gating control module connected with each area gating control module are determined according to specific signals of an area gating signal allocated to an individual area and a gate line gating signal allocated, respectively. In particular, with reference to FIG. 3a, for each area gating control module 11: when the area gating signal comprises K first sub-control signals with the logic value of 0 and J–K first sub-control signals with the logic value of 1, the area gating control module comprises K NOT gates 31 and a first AND gate 111 with J input terminals, wherein K is a natural number, input terminals of each NOT gate 31 of the K NOT gates 31 receive one of the K first sub-control signals, respectively, and output terminals of each NOT gate 31 of the K NOT gates 31 are connected with input terminals of the first AND gate 111 one by one, respectively, and K of the J input terminals of the first AND gate 111 are connected with the output terminals of the K NOT gates 31 one by one, respectively, the remaining input terminals of the first AND gate 111 receive the (J–K) first sub-control signals one by one, respectively, and the first AND gate 111 has one output terminal and it acts as the output terminal of the area gating control module 11.

Figure 4:
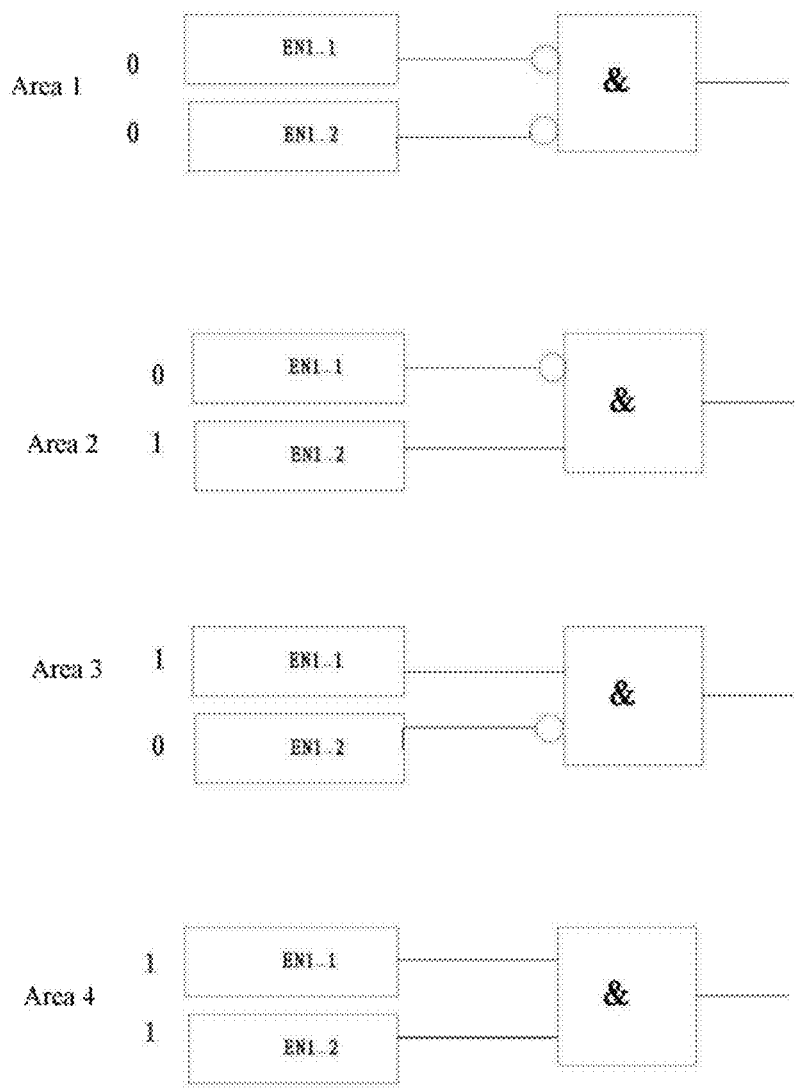
FIG. 4 shows a structure diagram of an area gating control module provided by Embodiment Two of the disclosure when the gate driving circuit is divided into 4 areas.

FIG. 4 presents an example of specific circuit diagrams of area gating control modules of individual areas when the gate driving circuit is divided into 4 areas and 2 first sub-control signals (EN1_1 and EN1_2, respectively) are used for control, namely, here K=1, and J=2. Therein, the area gating signals allocated to area 1, area 2, area 3 and area 4 are 00, 01, 10 and 11, respectively.

When the area control signal received by the area gating control module in area 1 is 00, area 1 is gated, and the other areas are not gated, when the area control signal received by the area gating control module in area 2 is 01, area 2 is gated, and the other areas are not gated, when the area control signal received by the area gating control module in area 3 is 10, area 3 is gated, and the other areas are not gated, and when the area control signal received by the area gating control module in area 4 is 11, area 4 is gated, and the other areas are not gated.

Figure 3A:
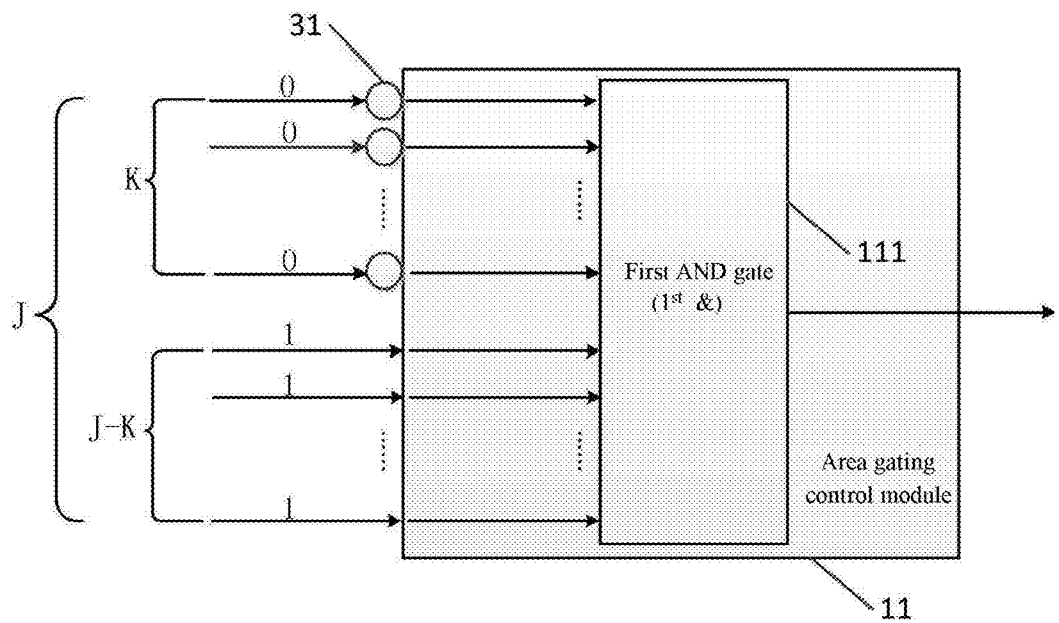
FIG. 3*a* shows a structure diagram of each area gating control module provided by Embodiment Two of the disclosure.
Figure 5A:
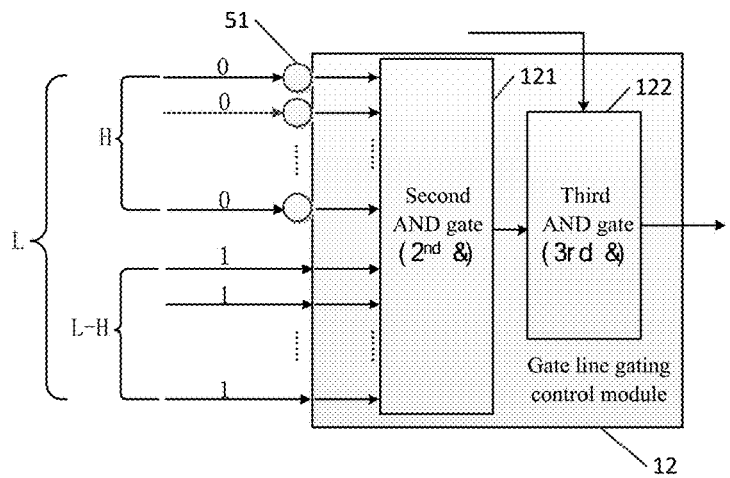
FIG. 5*a* shows a structure diagram of each gate line gating control module provided by Embodiment Two of the disclosure.

FIG. 5a presents an example of a gate line gating control module according to an embodiment of the disclosure. In one and the same area, corresponding to N gate lines, N gate line gating control modules 12 are disposed corresponding to N gate lines, respectively. For each gate line gating control module 12:

when the gate line gating signal comprises H first sub-control signals with the logic value of 0 and L–H second sub-control signals with the logic value of 1, the gate line gating control module comprises H NOT gates 51 and a second AND gate 121 with L input terminals, wherein H is a natural number, input terminals of each NOT gate 51 of the H NOT gates receive one of the H first sub-control signals, respectively, and output terminals of each NOT gate 51 of the H NOT gates 51 are connected with input terminals of the second AND gate 121 one by one, respectively, H of the L input terminals of the second AND gate 121 are connected with the output terminals of the H NOT gates 51 one by one, respectively, the remaining input terminals of the second AND gate 121 receive the (L–H) second sub-control signals one by one, respectively, and the gate line gating control module 12 further comprises a third AND gate 122 with two input terminals, the first input terminal of the third AND gate 122 is connected with an output terminal of the second AND gate 121, the second input terminal of the third AND gate 122 acts as an area gating signal input terminal for inputting an area gating signal and is connected with, for example, an output terminal of the area gating control module 11 of FIG. 3*a*, and an output terminal of the third AND gate 122 acts as the output terminal of the gate line gating control module 12 and outputs a gate line gating signal.

The number of the first sub-control signals is determined by the number of areas. For example, when the gate lines are divided into 10 areas, from $2^4=16>10$ and $2^3=8<10$, at least 4 first sub-control signals are needed.

The number of the second sub-control signals is jointly determined by the number of gate lines and the number of areas. For example, for a full high definition (FHD) resolution, 1920 gate lines are needed. For example, when the gate lines are divided into 10 areas, there are 192 gate lines in each area, and since $2^8=256>192$ and $2^7=128<192$, at least 8 second sub-control signals are needed.

Figure 6:
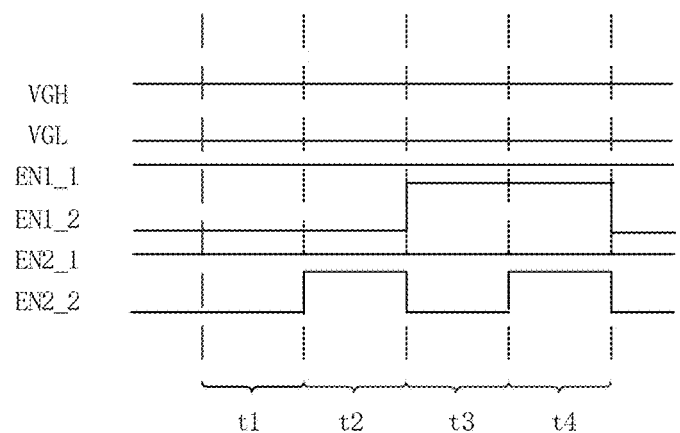
FIG. 6 shows an operational timing diagram of a gate driving circuit in Embodiment Two of the disclosure.

FIGS. 7-10 show specific circuit diagrams of Embodiment Two of the application when M is 2 and N is 2, and working principle diagrams when operating according to the timing given in FIG. 6, wherein the voltage value of the first level driving signal VGH and the second level driving signal VGL may for example be 12V, in particular, such as, VGH may take+12V, VGL may take −12V (the full name of VGH is VGateHigh and refers to the turn-on voltage of liquid crystal unit pixel points, of which each is a transistor, the full name of VGL is VGateLow and refers to the turn-off voltage of liquid crystal unit pixel points, and a screen circuit turns on/off pixel points by controlling the size of these two voltages to accomplish display control and picture change), whereas the EN1_1 signal and the EN1_2 signal are area control signals, the EN2_1 signal and the EN2_2 signal are row control signals, and they may for example take 1.8V when being logic 1, and may for example take −1.8V when being logic 0. In FIG. 6, VGH represents a driving signal of a higher first level, of which the logic value is set to 1, VGL represents a driving signal of a lower second level, of which the logic value is set to 0, the logic value of EN1_1 is always 1, and the logic value of EN2_1 is always 1. It needs to be noted that FIG. 6 is just a timing diagram showing schematically logic values, in which only 0 and non 0 are shown and the highness and alternatively lowness of a level is not shown.

Figure 7:
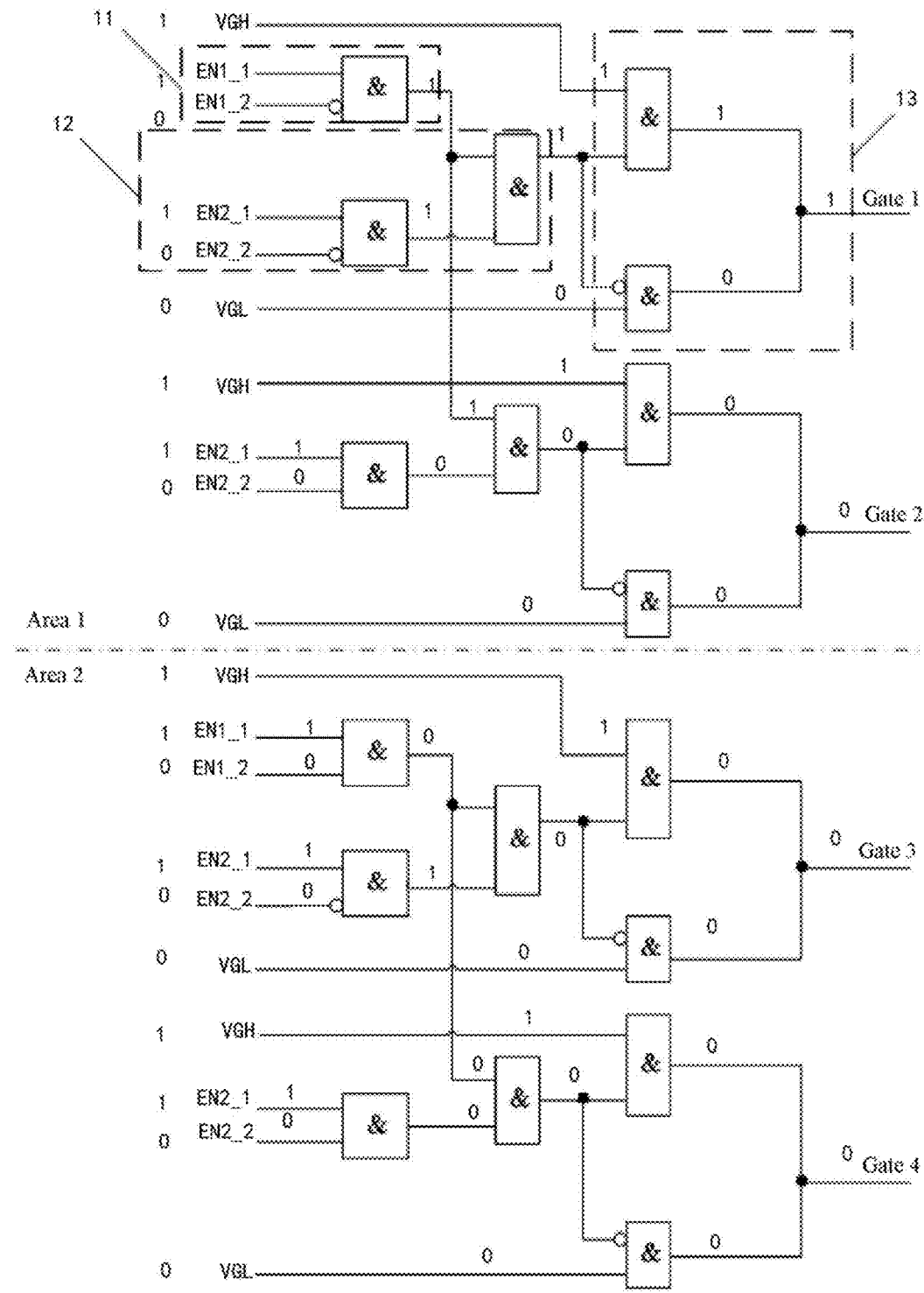
FIG. 7 shows a first work process diagram of the gate driving circuit provided by Embodiment Two of the disclosure.

In FIGS. 7-10, an input signal of the gate driving circuit in an individual timing and output signals of respective modules are demonstrated. FIG. 7 is a signal output case during a time period t1 of FIG. 6. According to the signal input of FIG. 6, in which at the time period t1, the input signal VGH is 1, VGL is 0, both EN1_1 and EN2_1 are 1 and both EN1_2 and EN2_2 are 0, it may be seen from the area gating control module 11 of FIG. 7 (in which there is a respective area gating control module 11 at a respective location in area 1 and area 2, and for the convenience of illustration, it is marked with a dashed box and a reference sign in area 1 and not marked again in area 2, however, the module may be determined according to the location correspondence) that area 1 is gated, and the output of an upper gate line gating control module 12 of area 1 (a lower gate line gating control module is not marked with a dashed box and a reference sign, but the module may be determined according to the module correspondence, and in the Figure, the individual modules in area 2 correspond to those in area 1 and are not marked with dashed boxes and reference signs again) is 1, and therefore, at gate 1 is output VGH, i.e., 1, and a corresponding gate line of the display panel circuit controlled by gate 1 is turned on.

Figure 8:
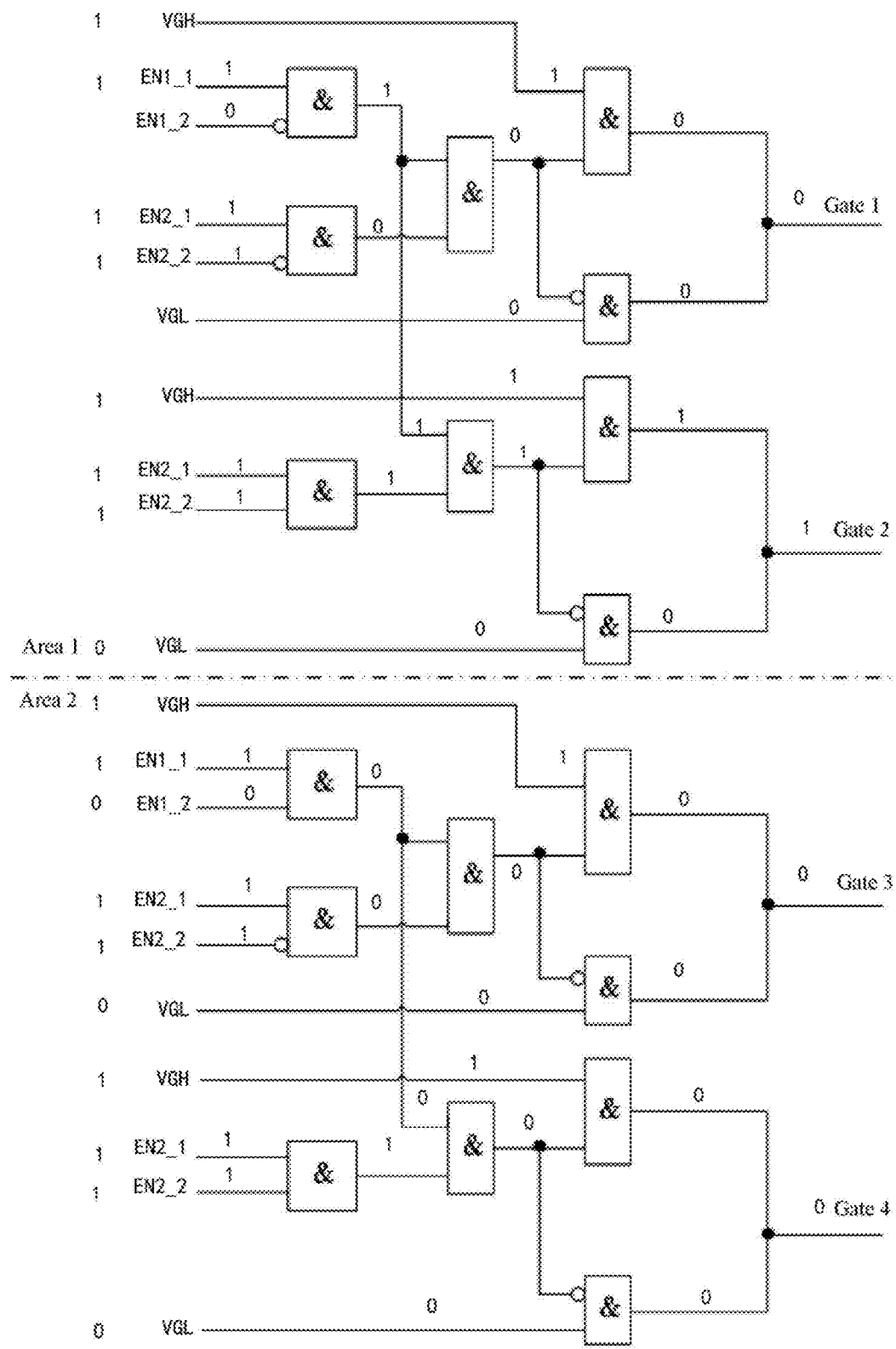
FIG. 8 shows a second work process diagram of the gate driving circuit provided by Embodiment Two of the disclosure.

FIG. 8 is a signal output case during a time period t2 of FIG. 6. According to the signal input of FIG. 6, in which at the time period t2, the input signal VGH is 1, VGL is 0, both EN1_1 and EN2_1 are 1, EN1_2 is 0, and EN2_2 is 1, it may be seen from the area gating control module of FIG. 8 (the module may be determined with reference to FIG. 7 according to the location correspondence) that still area 1 is gated, and the output of a lower gate line gating control module of area 1 (the module may be determined with reference to FIG. 7 according to the location correspondence) is 1, and therefore, at gate 2 is output VGH, i.e., 1, and a corresponding gate line of the display panel circuit controlled by gate 2 is turned on.

Figure 9:
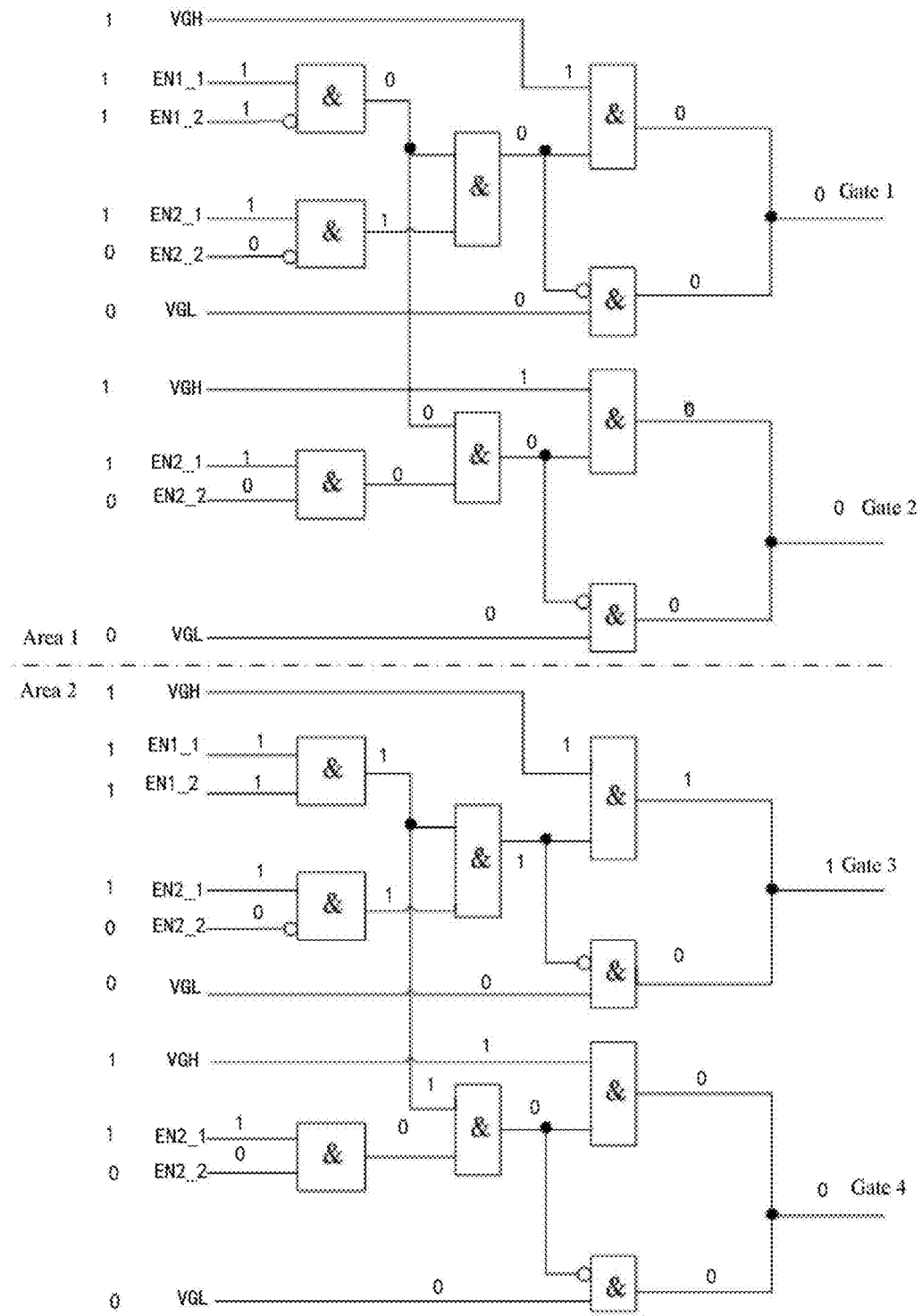
FIG. 9 shows a third work process diagram of the gate driving circuit provided by Embodiment Two of the disclosure.

FIG. 9 is a signal output case during a time period t3 of FIG. 6. According to the signal input of FIG. 6, in which at the time period t3, the input signal VGH is 1, VGL is 0, both EN1_1 and EN2_1 are 1, EN1_2 is 1, and EN2_2 is 0, it may be seen from the area gating control module of FIG. 9 (the module may be determined with reference to FIG. 7 according to the location correspondence) that area 2 is gated, and the output of an upper gate line gating control module of area 2 (the module may be determined with reference to FIG. 7 according to the location correspondence) is 1, and therefore, at gate 3 is output VGH, i.e., 1, and a corresponding gate line of the display panel circuit controlled by gate 3 is turned on.

Figure 10:
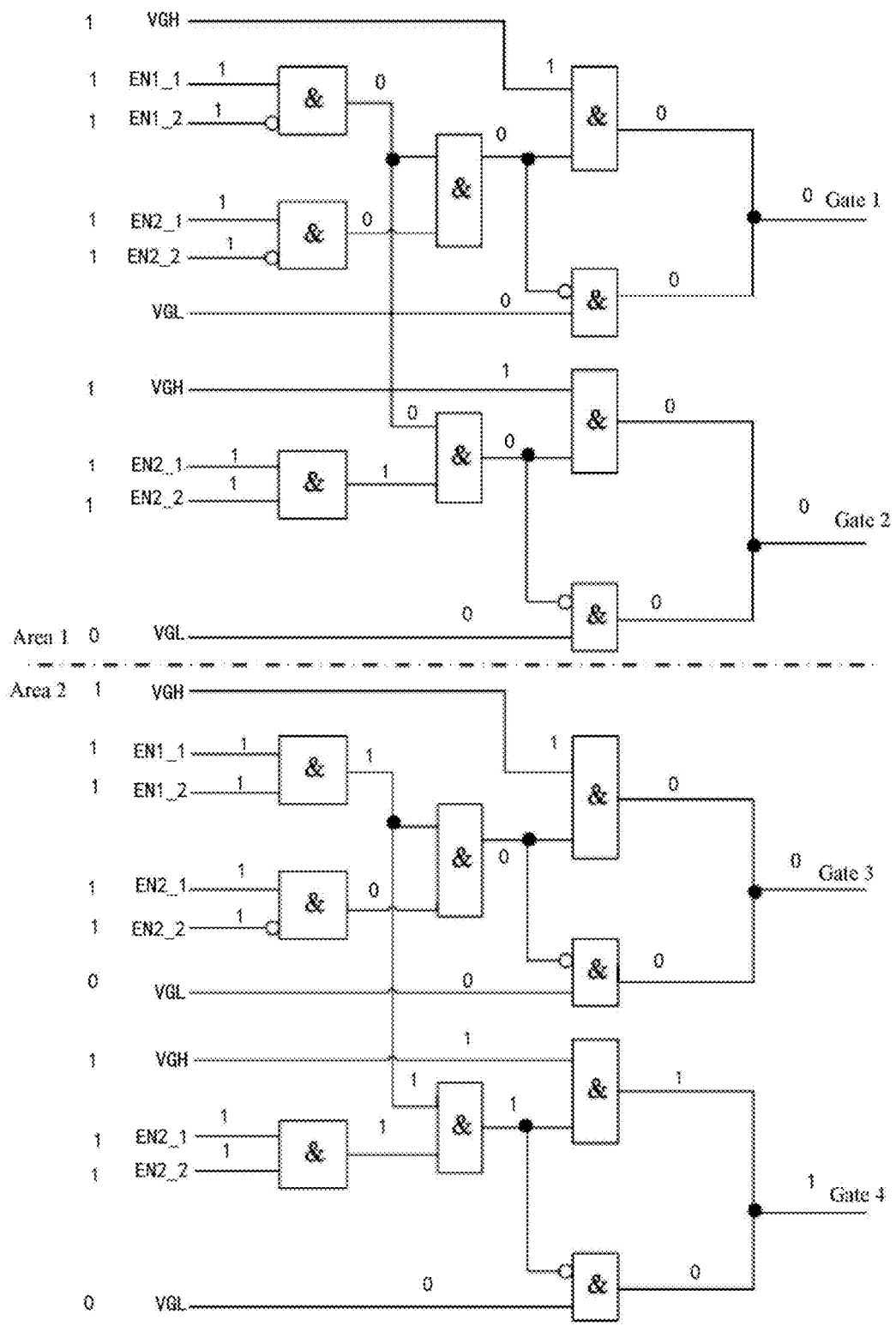
FIG. 10 shows a fourth work process diagram of the gate driving circuit provided by Embodiment Two of the disclosure.

FIG. 10 is a signal output case during a time period t4 of FIG. 6. According to the signal input of FIG. 6, in which at the time period t4, the input signal VGH is 1, VGL is 0, both EN1_1 and EN2_1 are 1, EN1_2 is 1, and EN2_2 is 1, it may be seen from the area gating control module of FIG. 10 (the module may be determined with reference to FIG. 7 according to the location correspondence) that area 2 is gated, and the output of a lower gate line gating control module of area 2 (the module may be determined with reference to FIG. 7 according to the location correspondence) is 1, and therefore, at gate 4 is output VGH, i.e., 1, and a corresponding gate line of the display panel circuit controlled by gate 4 is turned on.

In the embodiments of FIGS. 7-10, the number of area gating control modules depends on the number of areas into which the circuit to be driven is divided, whereas the number of gate line gating control modules depends on the number of gate lines divided in an area divided for the circuit to be driven. Although the number of gate line gating modules of each area shown in the embodiments is the same, the number of gate line gating modules of each area may be completely different, although the implementation of each area gating control module is identical, their implementations may be completely different, and likewise, although the implementation of each gate line gating module is identical, their implementations may be completely different. It needs to be noted that a gate driving signal output module may be disposed for each gate line in an area, and alternatively also a gate driving signal output module may be disposed for a group of gate lines in an area. The division of areas of the circuit to be driven and gate lines may be uniform, and alternatively also may not be uniform.

Embodiment Three

Figure 11:
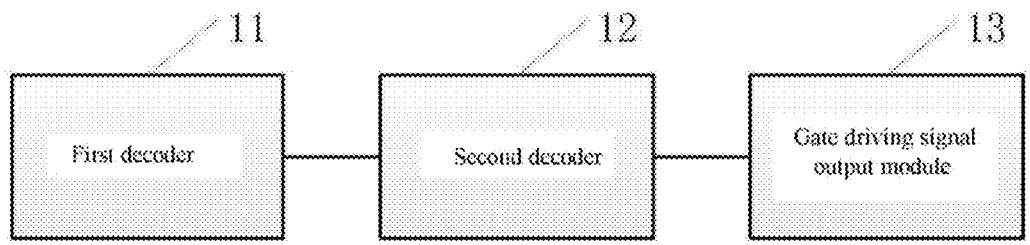
FIG. 11 shows a structure diagram of a gate driving circuit provided by Embodiment Three of the disclosure.

As shown in FIG. 11, it shows a schematic diagram of a gate driving circuit provided by Embodiment Three of the application. In FIG. 11, the area gating control module and the gate line gating control module are implemented by decoders, that is, in the above embodiments, the area gating control module comprises a first decoder 112, and each area comprises a second decoder 123.

Figure 3B:
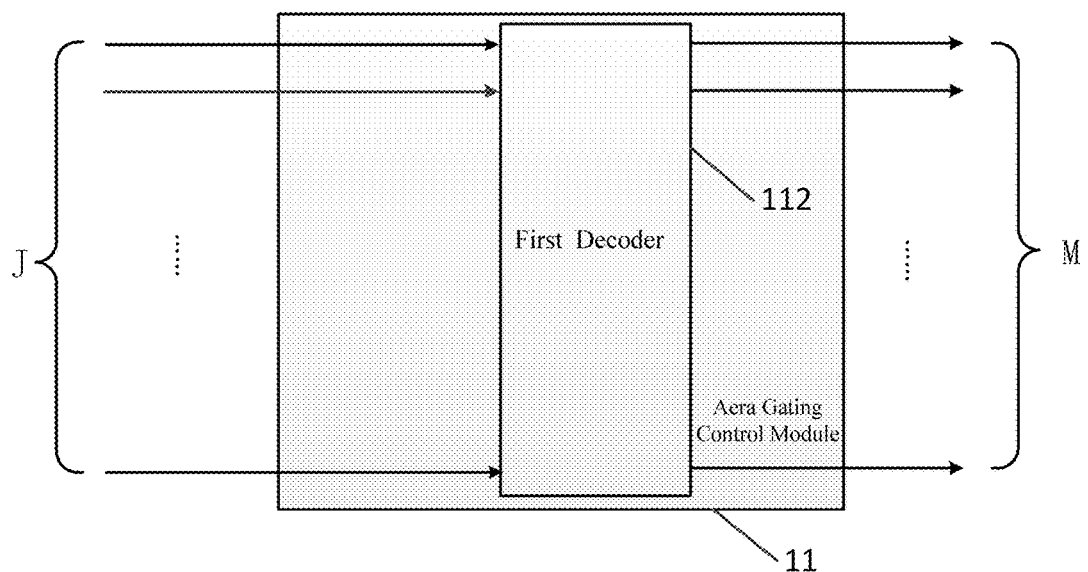
FIG. 3*b* shows a structure diagram of each area gating control module provided by Embodiment Three of the disclosure.

In particular, with reference to FIG. 3b, the first decoder 112 comprises J input terminals for receiving the area control signal and M output terminals for outputting the area gating signal. A decoder is employed to replace multiple logic circuits in Embodiment Two to implement an area gating control module.

Figure 5B:
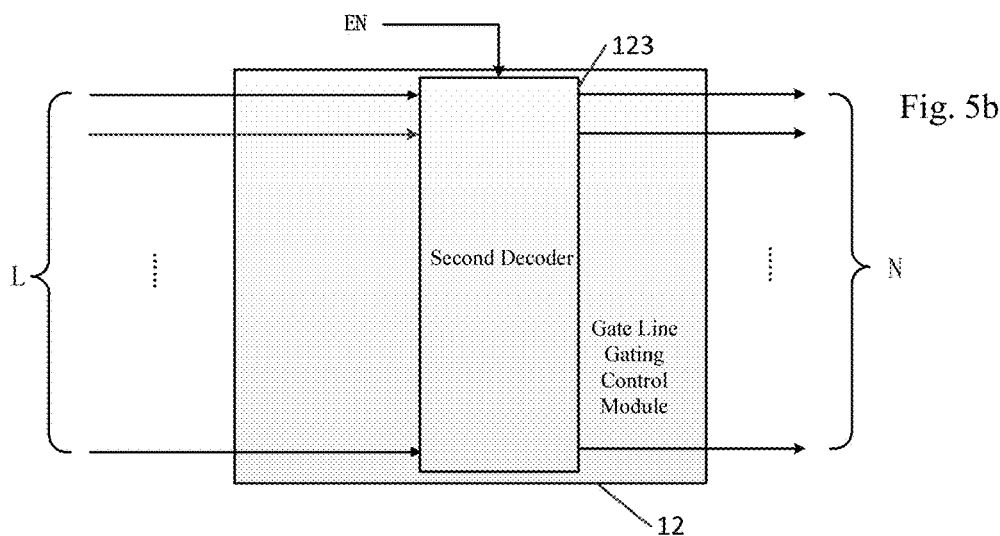
FIG. 5*b* shows a structure diagram of each gate line gating control module provided by Embodiment Three of the disclosure.

With reference to FIG. 5b, the second decoder 123 comprises L input terminals which act as a row control signal input terminal, an enable terminal EN which acts as an area gating signal input terminal for receiving the area gating signal, and N output terminals for outputting the gate line gating signal. A decoder is employed to replace multiple logic circuits in each area in Embodiment Two to implement a gate line gating control module.

The working principle of the solution of Embodiment Three of the disclosure is basically the same as that of the solution in Embodiment Two, and both are to divide areas, divide gate lines in each area, and finally use a different gate driving signal to drive a corresponding gate line, which will thus not be repeated here again.

Embodiment Four

Embodiment Four of the application provides a display device which comprises a gate driving circuit as described in any of Embodiment One to Embodiment Three.

In an example, the display panel of the display device comprises at least two sub-display areas, and the gate lines of one sub-display area are independent of those of the other and correspond to one gate driving circuit respectively as described.

Figure 12:
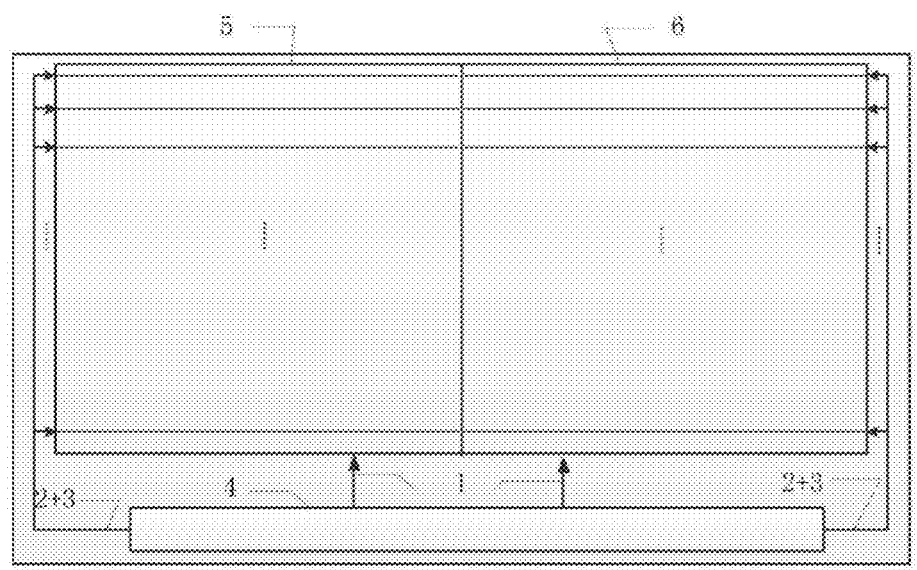
FIG. 12 shows a structure diagram of a display panel provided by Embodiment Four of the disclosure.

FIG. 12 presents a schematic diagram in which a sub-display area is included on both sides of the display panel, respectively. Each side has area control signal(s) and row control signal(s) (here, the gate lines of each row have been divided into two sections when preparing the display panel), and at this time, the area control signals of both the left and right sides control the left and right halves of pixel units corresponding to the data signals to charge and discharge, respectively. By the area control signals of both the left and right sides controlling halves of the pixels respectively, it may be possible that the data signals only need to be refreshed half in real time when displaying a special pattern (e.g., pattern display in a scenario in which split screen is needed), thereby reducing the power consumption. In FIG. 12, 1 represents an area control signal, 2 represents a row control signal, 3 represents a first level driving signal and a second level driving signal, 4 represents a driver IC, and 5 and 6 represent two partitions on the left and right.

In addition, it may further be possible to dispose two gate driving circuits as described on the display panel, wherein one gate driving circuit controls odd rows of gate lines of the display panel of the display device, and the other gate driving circuit controls even rows of gate lines of the display panel of the display device. A specific control timing may be designed according to the need of gating the odd rows of gate lines and the even rows of gate lines. Using such a solution, it may be possible to start the gate driving circuit which controls odd rows of gate lines of the display panel of the display device when it is necessary to scan only the odd rows of gate lines, and start the gate driving circuit which controls even rows of gate lines of the display panel of the display device when it is necessary to scan only the even rows of gate lines. When sequential scanning is needed, both are used in coordination.

Alternatively or optionally, it may be possible to dispose only one gate driving circuit, which is arranged with two gate driving signal output modules for each area, wherein one gate driving signal output module controls odd rows of gate lines in an area, and the other controls even rows of gate lines.

Clearly, various modifications and variations may be made to the embodiments of the invention by the person having ordinary skills in the art without departing from the spirit and scope of the invention. As such, the invention is also intended to include these modifications and variations, if the modifications and variations of the invention pertain to the scope of the claims of the invention and the equivalence thereof.

The invention claimed is:

1. A gate driving circuit, comprising:
    an area gating control module which comprises an area control signal input terminal for receiving an area control signal, and of which an output terminal outputs an area gating signal for gating a corresponding area in a circuit to be driven according to the received area control signal,
    a gate line gating control module which comprises a row control signal input terminal for receiving a row control signal and an area gating signal input terminal for receiving the area gating signal, and of which an output terminal outputs a gate line gating signal for gating a corresponding gate line in a gated area of the circuit to be driven according to the received row control signal and area gating signal, and
    a gate driving signal output module which comprises a gate line gating signal input terminal for receiving a gate line gating signal, a first level driving signal input terminal for receiving a driving signal for turning on a gate line and a second level driving signal input terminal for receiving a driving signal for turning off a gate line, and of which an output terminal is connected to a corresponding gate line, wherein in response to the logic value represented by the received gate line gating signal being 1, the gate driving signal output module outputs the driving signal for turning on the gate line, and in response to the logic value represented by the received gate line gating signal being not 1, outputs the driving signal for turning off the gate line.

2. The gate driving circuit as claimed in claim 1, wherein the gate driving signal output module comprises:
    a first AND gate of which a first input terminal receives the first level driving signal, of which a second input terminal receives the gate line gating signal output by the gate line gating control module, and of which the output terminal is connected to a gate line externally,
    a second AND gate of which a first input terminal receives the second level driving signal, of which a second input terminal receives a NOT signal of the gate line gating signal output by the gate line gating control module, and of which the output terminal is connected to the gate line externally, and
    a NOT gate of which an input terminal is connected with the output terminal of the gate line gating control module, and of which the output terminal is connected with the second input terminal of the second AND gate.

3. The gate driving circuit as claimed in claim 1, characterized in that, M areas of the circuit to be driven is controlled respectively, the area control signal is constituted by J first sub-control signals, and both M and J are positive integers, wherein the J-th power of 2 is greater than or equal to M, and each area is allocated a unique area gating signal.

4. The gate driving circuit as claimed in claim 3, wherein M area gating control modules are disposed corresponding to the M areas, respectively, when the area gating signal comprises K first sub-control signals with the logic value of 0 and J–K first sub-control signals with the logic value of 1, each of at least one of the M area gating control modules comprises K NOT gates and a first AND gate with J input terminals, wherein K is a natural number, input terminals of each NOT gate of the K NOT gates receive one of the K first sub-control signals, respectively, and output terminals of each NOT gate of the K NOT gates are connected with input terminals of the first AND gate one by one, respectively, and K of the J input terminals of the first AND gate are connected with the output terminals of the K NOT gates one by one, respectively, the remaining input terminals of the first AND gate receive the (J–K) first sub-control signals one by one, respectively, and the first AND gate has one output terminal and it outputs an area gating control signal as the output terminal of each of the at least one area gating control modules.

5. The gate driving circuit as claimed in claim 3, wherein the area gating control module comprises a first decoder, and the first decoder comprises J input terminals for receiving the area control signal and M output terminals for outputting the area gating signal.

6. The gate driving circuit as claimed in claim 1, wherein M areas of the circuit to be driven is controlled respectively, each area corresponds to N groups of gate lines, the row control signal is constituted by L second sub-control signals, and M, N and L are positive integers, wherein the L-th power of 2 is greater than or equal to N, and in one and the same area, each group of gate lines is allocated a unique gate line gating signal.

7. The gate driving circuit as claimed in claim 6, wherein for each of at least one of the M areas, N gate line gating control modules are disposed corresponding to N groups of gate lines therein, when the gate line gating signal comprises H first sub-control signals with the logic value of 0 and L–H second sub-control signals with the logic value of 1, the gate line gating control module comprises H NOT gates and a second AND gate with L input terminals, wherein H is a natural number, input terminals of each NOT gate of the H NOT gates receive one of the H first sub-control signals, respectively, and output terminals of each NOT gate of the H NOT gates are connected with the second AND gate, H of the L input terminals of the second AND gate are connected with the output terminals of the H NOT gates one by one, respectively, the remaining input terminals of the second AND gate receive the (L–H) second sub-control signals one by one, respectively, and the gate line gating control module further comprises a third AND gate with two input terminals, the first input terminal of the third AND gate is connected with an output terminal of the second AND gate, the second input terminal of the third AND gate acts as an area gating signal input terminal for inputting the area gating signal and is connected with an output terminal of the area gating control module, and an output terminal of the third AND gate acts as the output terminal of the gate line gating control module.

8. The gate driving circuit as claimed in claim 6, wherein for each of at least one of the M areas, a second decoder is comprised, the second decoder comprises L input terminals which act as row control signal input terminals for inputting the row control signal, an enable terminal which acts as an area gating signal input terminal for inputting the area gating signal, and N output terminals for outputting the gate line gating signal.

9. A display device, characterized by comprising a gate driving circuit as claimed in claim 1.

10. The display device as claimed in claim 9, wherein the display panel of the display device comprises at least two sub-display areas, and the gate lines of one sub-display area are independent of those of the other sub-display area and are commonly driven by one said gate driving circuit respectively.

11. The display device as claimed in claim 9, characterized by comprising two said gate driving circuits, wherein one gate driving circuit controls odd rows of gate lines of the display panel of the display device, and the other gate driving circuit controls even rows of gate lines of the display panel of the display device.

12. A display device, characterized by comprising a gate driving circuit as claimed in claim 2.

13. A display device, characterized by comprising a gate driving circuit as claimed in claim 3.

14. A display device, characterized by comprising a gate driving circuit as claimed in claim 4.

15. A display device, characterized by comprising a gate driving circuit as claimed in claim 5.

16. A display device, characterized by comprising a gate driving circuit as claimed in claim 6.

17. A display device, characterized by comprising a gate driving circuit as claimed in claim 7.

18. A display device, characterized by comprising a gate driving circuit as claimed in claim 8.

* * * * *